US009391271B1

(12) United States Patent
Hsu et al.

(10) Patent No.: US 9,391,271 B1
(45) Date of Patent: Jul. 12, 2016

(54) RESISTIVE RANDOM ACCESS MEMORY AND MANUFACTURING METHOD THEREOF

(71) Applicant: Powerchip Technology Corporation, Hsinchu (TW)

(72) Inventors: Mao-Teng Hsu, Taipei (TW); Chiu-Tsung Huang, Hsinchu (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/670,429

(22) Filed: Mar. 27, 2015

(30) Foreign Application Priority Data

Dec. 31, 2014 (TW) .............................. 103146539 A

(51) Int. Cl.
| | | |
|---|---|---|
| H01L 29/80 | (2006.01) |
| H01L 21/00 | (2006.01) |
| H01L 21/337 | (2006.01) |
| H01L 45/00 | (2006.01) |
| H01L 27/24 | (2006.01) |

(52) U.S. Cl.
CPC ........ *H01L 45/1233* (2013.01); *H01L 27/2454* (2013.01); *H01L 45/1616* (2013.01); *H01L 45/1675* (2013.01)

(58) Field of Classification Search
CPC ........... G11C 13/0004; G11C 13/0002; G11C 17/165; G11C 11/5607; G11C 16/12; H01L 45/06; H01L 27/24; H01L 27/2454; H01L 27/222
USPC ............ 257/263, 302, 327, 328, 618; 438/95, 438/156, 173, 192, 212, 268
See application file for complete search history.

(56) References Cited

U.S. PATENT DOCUMENTS

| | | |
|---|---|---|
| 6,531,371 B2 | 3/2003 | Hsu et al. |
| 6,870,755 B2 | 3/2005 | Rinerson et al. |
| 7,067,865 B2 | 6/2006 | Lung |
| 7,292,469 B2 | 11/2007 | Lee et al. |

(Continued)

OTHER PUBLICATIONS

I. G. Baek, et al., "Realization of Vertical Resistive Memory (VRRAM) using cost effective 3D Process," 2011 IEEE International Electron Devices Meeting (IEDM), Dec. 5-7, 2011, pp. 31.8.1-31.8.4.
W.C. Chien, et al., "Multi-Layer Sidewall WOx Resistive Memory Suitable for 3D ReRAM," 2012 Symposium on VLSI Technology (VLSIT), Jun. 12-14, 2012, pp. 153-154.

(Continued)

*Primary Examiner* — Hsien Ming Lee
(74) *Attorney, Agent, or Firm* — Jianq Chyun IP Office

(57) ABSTRACT

A resistive random access memory including a substrate, a dielectric layer, and at least one memory cell string is provided. The dielectric layer is disposed on the substrate. The memory cell string includes memory cells and at least one first interconnect structure. The memory cells are vertically and adjacently disposed in the dielectric layer, and each memory cells includes a first conductive line, a second conductive line, and a variable resistance structure. The second conductive line is disposed at one side of the first conductive line, and the top surface of the second conductive line is higher than the top surface of the first conductive line. The variable resistance structure is disposed between the first conductive line and the second conductive line. The variable resistance structures in the vertically adjacent memory cells are isolated from each other. The first interconnect structure is connected to the vertically adjacent first conductive lines.

20 Claims, 14 Drawing Sheets

(56) References Cited

U.S. PATENT DOCUMENTS

| | | |
|---|---|---|
| 8,471,232 B2 | 6/2013 | Kim et al. |
| 8,617,952 B2 | 12/2013 | Kim et al. |
| 8,674,332 B2 | 3/2014 | Toh et al. |
| 8,981,448 B2 * | 3/2015 | Park .................... H01L 27/2454 257/288 |
| 2012/0327701 A1 | 12/2012 | Nazarian |
| 2013/0240821 A1 | 9/2013 | Toh et al. |

OTHER PUBLICATIONS

Leqi Zhang, et al., "Analysis of Vertical Cross-Point Resistive Memory (VRRAM) for 3D RRAM Design," 2013 5th IEEE International Memory Workshop (IMW), May 26-29, 2013, pp. 155-158.

Hong-Yu Chen, et al., "HfOx Based Vertical Resistive Random Access Memory for Cost-Effective 3D Cross-Point Architecture without Cell Selector," 2012 IEEE International Electron Devices Meeting (IEDM), Dec. 10-13, 2012, pp. 20.7.1-20.7.4.

* cited by examiner

RESISTIVE RANDOM ACCESS MEMORY AND MANUFACTURING METHOD THEREOF

CROSS-REFERENCE TO RELATED APPLICATION

This application claims the priority benefit of Taiwan application serial no. 103146539, filed on Dec. 31, 2014. The entirety of the above-mentioned patent application is hereby incorporated by reference herein and made a part of this specification.

BACKGROUND OF THE INVENTION

1. Field of the Invention

The invention relates to a memory and a manufacturing method thereof, and more particularly, to a resistive random access memory and a manufacturing method thereof.

2. Description of Related Art

A non-volatile memory has the advantage of retaining data after being disconnected. Therefore, many electronic products require the non-volatile memory to maintain normal operation when the electronic products are turned on. Currently, one non-volatile memory device actively developed by industries is a resistive random access memory (RRAM), and the RRAM has advantages such as low write operation voltage, short write erase time, long memory time, non-destructive reading, multi-state memory, simple structure, and small required area. As a result, the RRAM has the potential to become one of the widely adopted non-volatile memory devices in personal computers and electronic equipment in the future.

To increase the density of a memory, current industries have proposed a high-density vertically-arranged 3D resistive random access memory (3D RRAM). However, the manufacturing method of the current 3D RRAM commonly involves with a deep etching process and a deep filling process and therefore, cannot be directly integrated with an advanced logic process.

SUMMARY OF THE INVENTION

The invention provides a resistive random access memory (RRAM) and a manufacturing method thereof capable of being directly integrated with an advanced logic process.

The invention provides a RRAM including a substrate, a dielectric layer, and at least one memory cell string. The dielectric layer is disposed on the substrate. The memory cell string includes a plurality of memory cells and at least one first interconnect structure. The memory cells are vertically and adjacently disposed in the dielectric layer, and each of the memory cells includes a first conductive line, a second conductive line, and a variable resistance structure. The second conductive line is disposed at one side of the first conductive line, and the top surface of the second conductive line is higher than the top surface of the first conductive line. The variable resistance structure is disposed between the first conductive line and the second conductive line. The variable resistance structures in the vertically adjacent memory cells are isolated from each other. The first interconnect structure is connected to the vertically adjacent first conductive lines.

According to an embodiment of the invention, in the RRAM, the interconnect structure includes a first connecting portion and a second connecting portion. The first connecting portion is electrically connected to the bottom one of two vertically adjacent first conductive lines. The second connecting portion is electrically connected to the first connecting portion and the top one of two vertically adjacent first conductive lines.

According to an embodiment of the invention, in the RRAM, the shape of the first connecting portion is, for instance, a rectangle shape or a T shape.

According to an embodiment of the invention, in the RRAM, the first conductive line and the second connecting portion therebelow are, for instance, an integrally formed component or independent components.

According to an embodiment of the invention, in the RRAM, the variable resistance structure can be extended to between the second conductive line and the dielectric layer.

According to an embodiment of the invention, in the RRAM, when the at least one memory cell string is a plurality of memory cells, two memory cells located between two horizontally adjacent second conductive lines can share the first conductive line located therebetween.

According to an embodiment of the invention, in the RRAM, when the at least one memory cell string is a plurality of memory cells, two memory cells located between two horizontally adjacent first conductive lines can share the second conductive line located therebetween.

According to an embodiment of the invention, the RRAM further includes at least one transistor disposed on the substrate. A terminal of the transistor is electrically connected to the first conductive line via at least one second interconnect structure.

According to an embodiment of the invention, when the at least one transistor is a plurality of transistors, the RRAM further includes at least one isolation structure. The at least one isolation structures is disposed in the substrate, and the transistors are isolated from one another via the at least one isolation structure.

The invention provides a manufacturing method of an RRAM including the following steps. A dielectric layer is formed on a substrate. At least one memory cell string is formed in the dielectric layer. The memory cell string includes a plurality of memory cells and at least one first interconnect structure. The memory cells are vertically and adjacently disposed in the dielectric layer, and each of the memory cells includes a first conductive line, a second conductive line, and a variable resistance structure. The second conductive line is disposed at one side of the first conductive line, and the top surface of the second conductive line is higher than the top surface of the first conductive line. The variable resistance structure is disposed between the first conductive line and the second conductive line. The variable resistance structures in the vertically adjacent memory cells are isolated from each other. The first interconnect structure is connected to the vertically adjacent first conductive lines.

According to an embodiment of the invention, in the manufacturing method of the RRAM, the forming method of the dielectric layer is, for instance, a chemical vapor deposition method.

According to an embodiment of the invention, in the manufacturing method of the RRAM, the forming method of the first conductive lines is, for instance, a damascene method or a combination of a lithography process, an etching process, and a deposition process.

According to an embodiment of the invention, in the manufacturing method of the RRAM, the interconnect structure includes a first connecting portion and a second connecting portion. The first connecting portion is electrically connected to the bottom one of two vertically adjacent first conductive lines. The second connecting portion is electrically connected to the first connecting portion and the top one of two vertically adjacent first conductive lines.

According to an embodiment of the invention, in the manufacturing method of the RRAM, the forming method of the variable resistance structures, the second conductive lines, and the first connecting portion includes the following steps. A first opening and a second opening are formed in the dielectric layer. The portion of the first opening exposes the sidewall of each of the first conductive lines, and the second opening exposes the portion of each of the first conductive lines. A variable resistance material layer is conformally formed in the first opening. An etch-back process is performed on the variable resistance material layer. A conductive line material layer completely filling the first opening and the second opening is formed. The conductive line material layer outside the first opening and the second opening is removed.

According to an embodiment of the invention, in the manufacturing method of the RRAM, the shape of the first connecting portion is, for instance, a rectangle shape or a T shape.

According to an embodiment of the invention, in the manufacturing method of the RRAM, when the shape of the first connecting portion is a rectangle shape, the forming method of the first connecting portion is, for instance, a single damascene method.

According to an embodiment of the invention, in the manufacturing method of the RRAM, when the shape of the first connecting portion is a T shape, the forming method of the first connecting portion is, for instance, a dual damascene method.

According to an embodiment of the invention, in the manufacturing method of the RRAM, each of the first conductive lines and the second connecting portion therebelow are, for instance, integrally formed or independently formed.

According to an embodiment of the invention, the manufacturing method of the RRAM further includes forming at least one transistor on the substrate before the dielectric layer is formed. A terminal of the transistor is electrically connected to the first conductive line via at least one second interconnect structure.

According to an embodiment of the invention, the manufacturing method of the RRAM further includes, when the at least one transistor is a plurality transistors, forming at least one isolation structure in the substrate, and the transistors are isolated from one another via the isolation structures.

Based on the above, in the RRAM and the manufacturing method thereof provided in the invention, the variable resistance structures in the vertically adjacent memory cells are isolated from one another, the vertically adjacent first conductive lines are connected via the first interconnect structure, and the top surface of the second conductive line is higher than the top surface of the first conductive line. As a result, in the manufacturing process of the RRAM, a deep etching process and a deep hole-filling process do not need to be performed, and therefore the manufacturing process can be directly integrated with an advanced logic process (such as a complementary metal-oxide-semiconductor (CMOS) logic process).

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
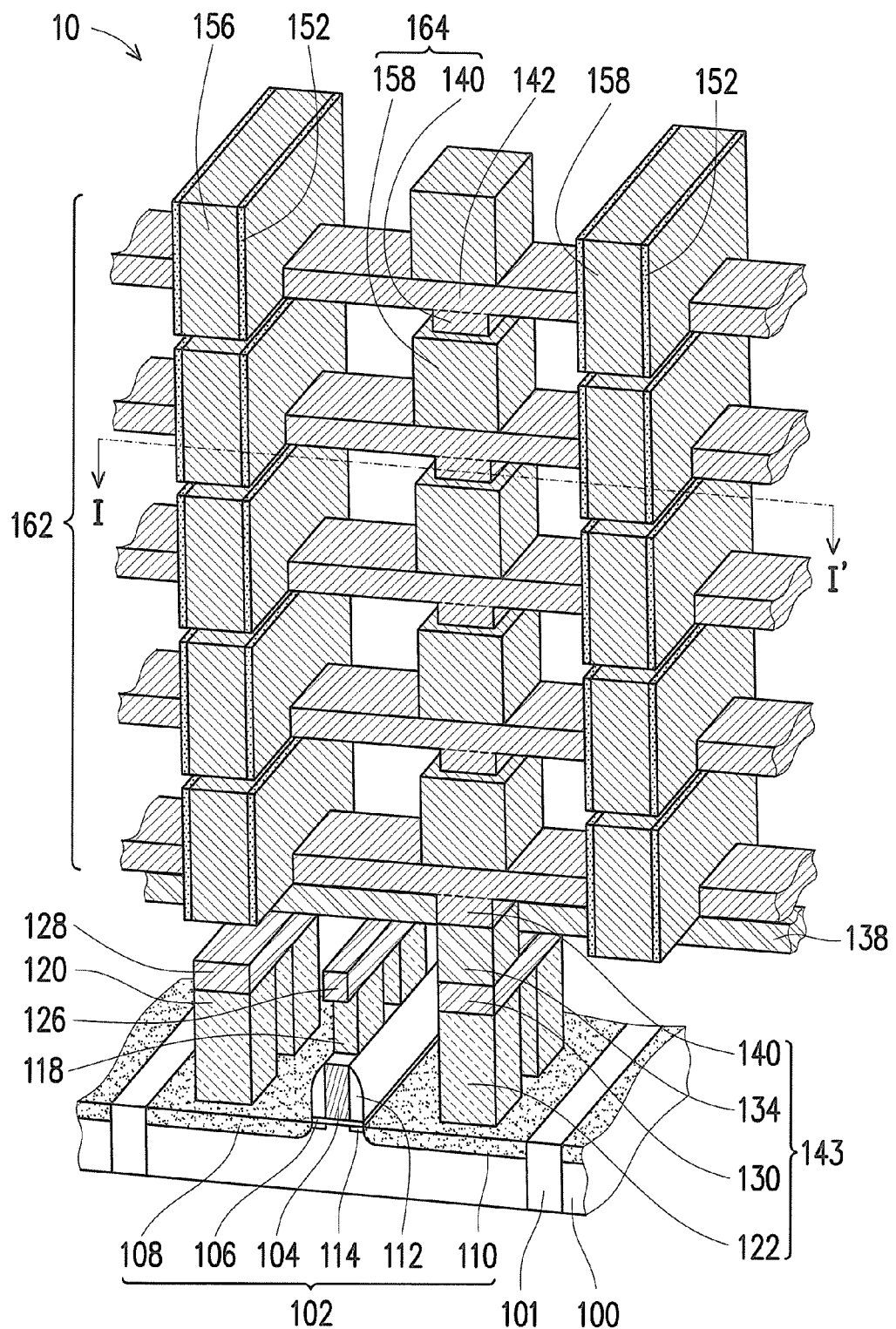
FIG. 1 is a three-dimensional view of a resistive random access memory (RRAM) of an embodiment of the invention.

FIG. 1 is a three-dimensional view of a resistive random access memory (RRAM) of an embodiment of the invention. In FIG. 1, for ease of description, dielectric layers and variable resistance structures on the sidewalls of connecting portions are not shown. FIG. 2A to FIG. 2F are top views illustrating a manufacturing process of the RRAM of FIG. 1. FIG. 3A to FIG. 3F are cross-sectional views illustrating a manufacturing process of the RRAM in FIG. 1 and FIG. 2 along line I-I'.

Figure 2A:
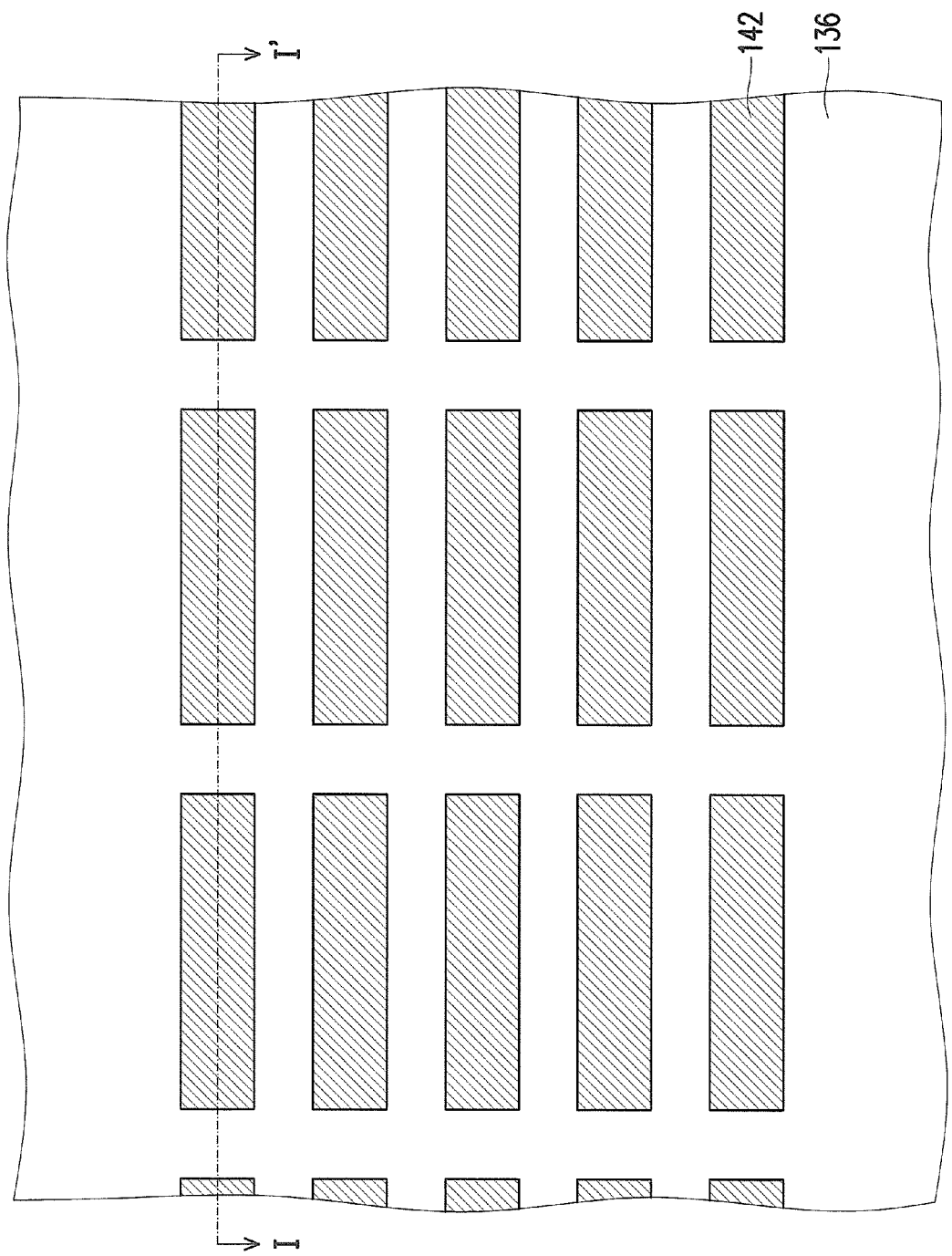
FIG. 2A to FIG. 2F are top views illustrating a manufacturing process of the RRAM of FIG. 1.
Figure 3A:
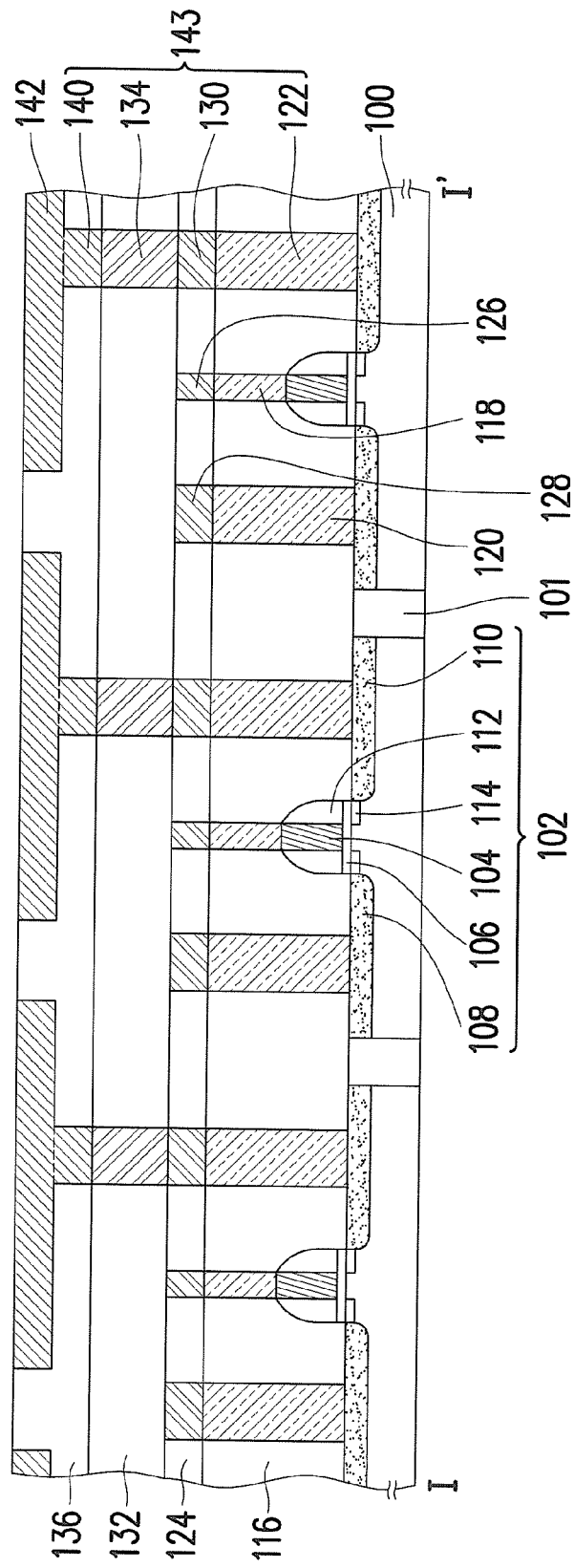
FIG. 3A to FIG. 3F are cross-sectional views illustrating a manufacturing process of the RRAM in FIG. 1 and FIG. 2 along line I-I'.

First, referring to FIG. 1, FIG. 2A, and FIG. 3A at the same time, at least one transistor 102 can be optionally formed on a substrate 100. The transistor 102 is, for instance, a metal-oxide-semiconductor field-effect transistor (MOSFET) or a bipolar junction transistor (BJT). In the present embodiment, using FIG. 2A as an example, three transistors 102 are formed, but the invention is not limited thereto.

In the present embodiment, the transistors 102 are exemplified as MOSFETS, but the invention is not limited thereto. Each of the transistors 102 includes a gate 104, a gate dielectric layer 106, a doped region 108, a doped region 110, a spacer 112, and a doped extension region 114. The gate dielectric layer 106 is located between the gate 104 and the substrate 100. The doped regions 108 and 110 are respectively located in the substrate 100 at two sides of the gate 104. In the present embodiment, the doped region 108 and the doped region 110 can be respectively used as the terminals of the transistor 102. For instance, the doped region 108 can be used as the source, and the doped region 110 can be used as the drain. The spacer 112 is located on the substrate 100 at two sides of the gate 104. The doped extension region 114 is located in the substrate 100 below the spacer 112 and can be used as a lightly-doped drain (LDD). The material of each of the components in the transistor 102 is known to those skilled in the art and is therefore not repeated herein.

Moreover, before the transistors 102 are formed, at least one isolation structure 101 can be further formed in the substrate 100. The transistors 102 are isolated from one another via the isolation structures 101. The isolation structures 101 are, for instance, shallow-trench isolation (STI) structures. The material of the isolation structures 101 is, for instance, silicon oxide. The manufacturing method of the isolation structures 101 is known to those skilled in the art and is therefore not repeated herein.

Then, a dielectric layer 116 and conductive layers 118, 120, and 122 located in the dielectric layer 116 are formed on the substrate 100. A dielectric layer 124 and conductive layers 126, 128, and 130 located in the dielectric layer 124 are formed on the dielectric layer 116. A dielectric layer 132 and a conductive layer 134 located in the dielectric layer 132 are formed on the dielectric layer 124. A dielectric layer 136 is formed on the dielectric layer 132. The material of the dielectric layers 116, 124, 132, and 136 is, for instance, a dielectric material such as silicon oxide. The forming method of the dielectric layers 116, 124, 132, and 136 is, for instance, a chemical vapor deposition method. The material of the conductive layers 118, 120, 122, 126, 128, 130, and 134 is, for instance, a conductive material such as tungsten, copper, or aluminum. The forming method of the conductive layers 118, 120, 122, 126, 128, 130, and 134 can include a combination of a lithography process, an etching process, and a deposition process, or a damascene method.

In particular, the conductive layer 126 can be used as a word line and can be electrically connected to the gate 104 via the conductive layer 118. The conductive layer 128 can be connected to a source line 138 (as shown in FIG. 1) and can be electrically connected to the doped region 108 via the conductive layer 120.

Then, a connecting portion 140 and a conductive line 142 are formed in the dielectric layer 136. The conductive line 142 and the connecting portion 140 therebelow are connected to each other. Moreover, two adjacent conductive lines 142 are separately disposed. The material of each of the connecting portion 140 and the conductive line 142 is, for instance, copper, tungsten, or aluminum. The conductive line 142 and the connecting portion 140 therebelow are, for instance, integrally formed or independently formed. That is, the conductive line 142 and the connecting portion 140 therebelow can be an integrally formed component or independent components. When the conductive line 142 and the connecting portion 140 therebelow are integrally formed, the forming method of the conductive line 142 and the connecting portion 140 includes, for instance, forming the conductive line 142 and the connecting portion 140 at the same time via a dual damascene method. When the conductive line 142 and the connecting portion 140 therebelow are independently formed, the forming method of the conductive line 142 and the connecting portion 140 is, for instance, a single damascene method or a combination of a lithography process, an etching process, and a deposition process. In the present embodiment, the conductive line 142 and the connecting portion 140 therebelow are integrally formed as an example.

Moreover, the conductive layers 122, 130, 134, and 140 can form an interconnect structure 143 connected to the doped region 110. Moreover, the conductive line 142 can be electrically connected to the doped region 110 (i.e., terminal) of the transistor 102 via the interconnect structure 143.

Figure 2B:
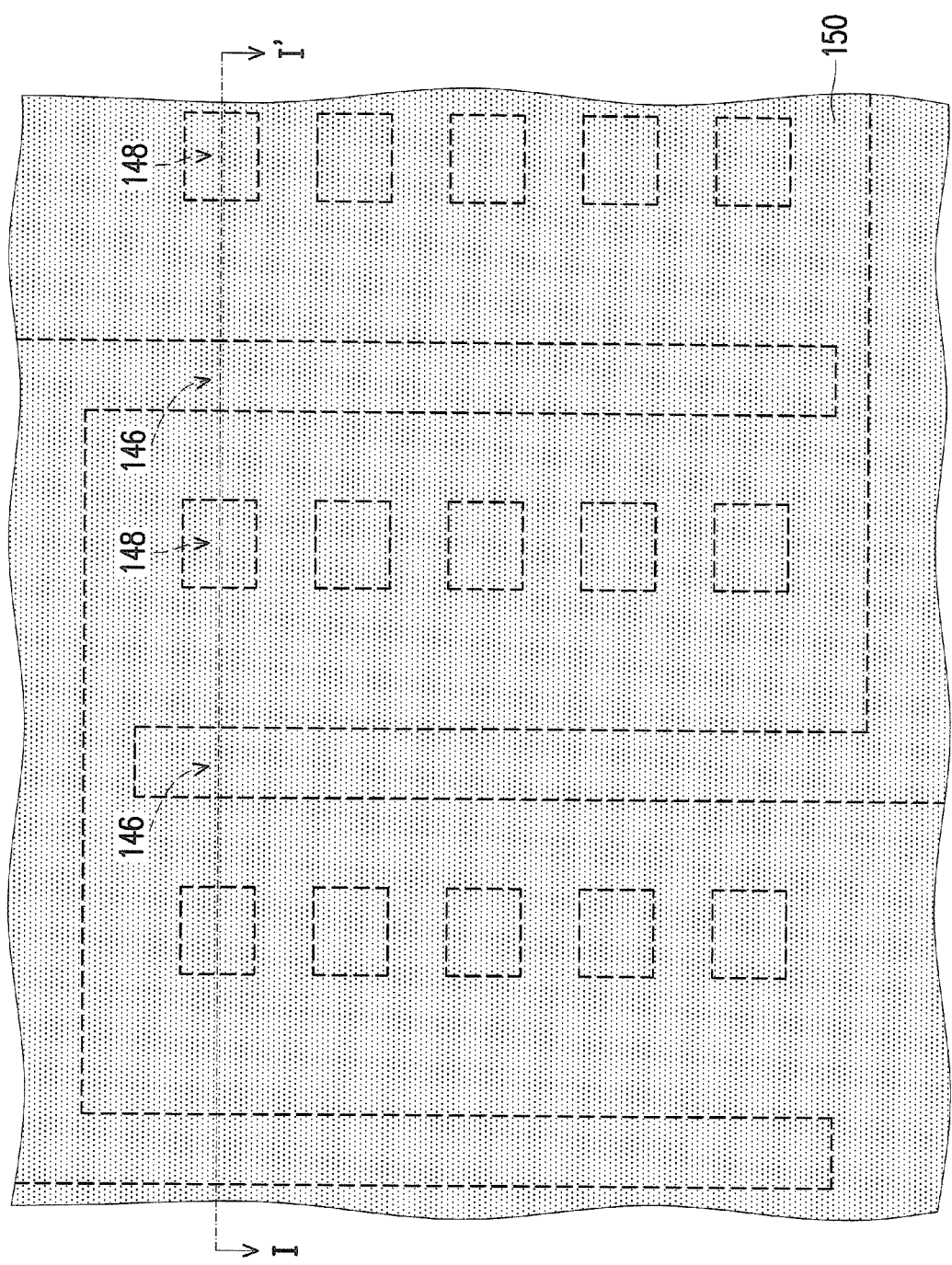
Figure 3B:
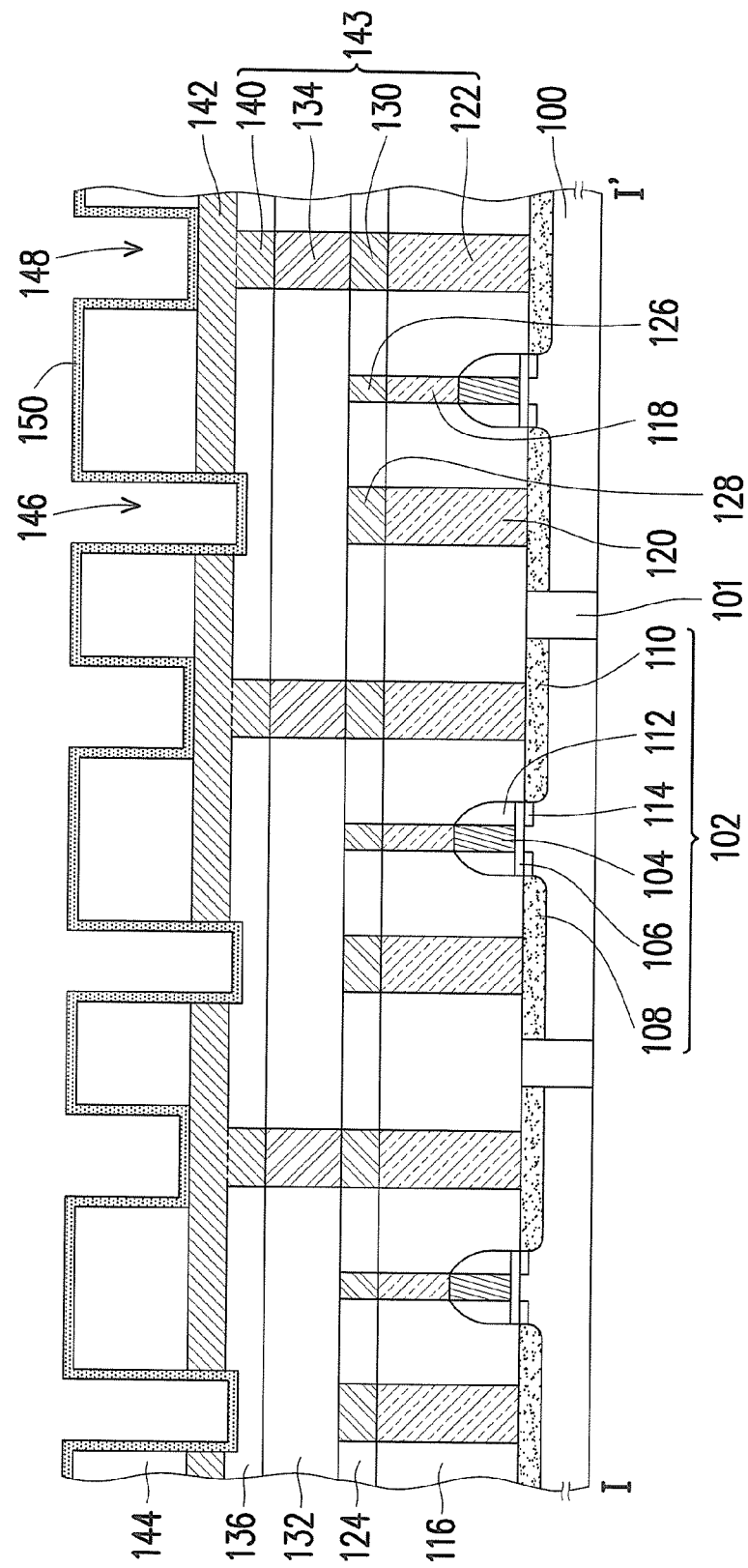

Then, referring to FIG. 1, FIG. 2B, and FIG. 3B at the same time, a dielectric layer 144 is formed on the dielectric layer 136. The material of the dielectric layer 144 is, for instance, a dielectric material such as silicon oxide. The forming method of the dielectric layer 144 is, for instance, a chemical vapor deposition method.

Then, an opening 146 and an opening 148 are formed in the dielectric layer 144. A portion of the opening 146 exposes the sidewall of the conductive line 142, and the opening 148 exposes a portion of the conductive line 142. The bottom portion of the opening 146 can be slightly lower than the bottom surface of the conductive line 142. As shown in FIG. 2B, the shape of the opening 146 is, for instance, a finger shape, but the invention is not limited thereto. In another embodiment, the shape of the opening 146 can also be a strip shape. As shown in FIG. 3B, the shape of the opening 148 is, for instance, a rectangle shape, but the invention is not limited thereto. In another embodiment, the shape of the opening 148 can also be a T shape. The opening 146 and the opening 148 are, for instance, formed by performing a patterning process on the dielectric layer 144 and the dielectric layer 136. Moreover, the depth of the opening 146 can be controlled via an etching process.

Then, a variable resistance material layer 150 is conformally formed in the opening 146. At this point, the variable resistance material layer 150 is also conformally formed in the opening 148 and on the dielectric layer 144. The material of the variable resistance material layer 150 is, for instance, a metal oxide such as hafnium oxide, magnesium oxide, nickel oxide, niobium oxide, titanium oxide, aluminum oxide, vanadium oxide, tungsten oxide, zinc oxide, or cobalt oxide. The forming method of the variable resistance material layer 150 is, for instance, a chemical vapor deposition method.

Figure 2C:
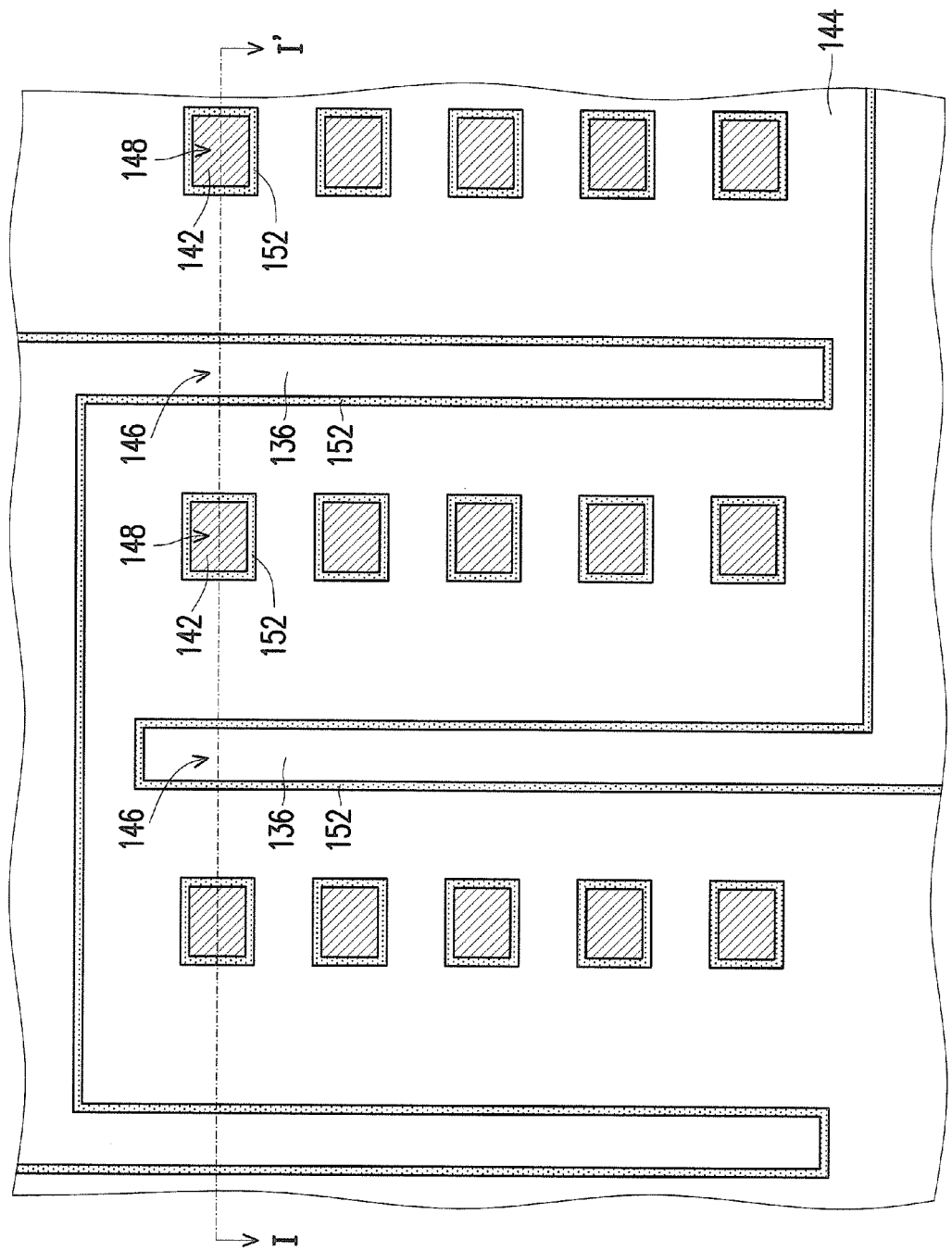
Figure 3C:
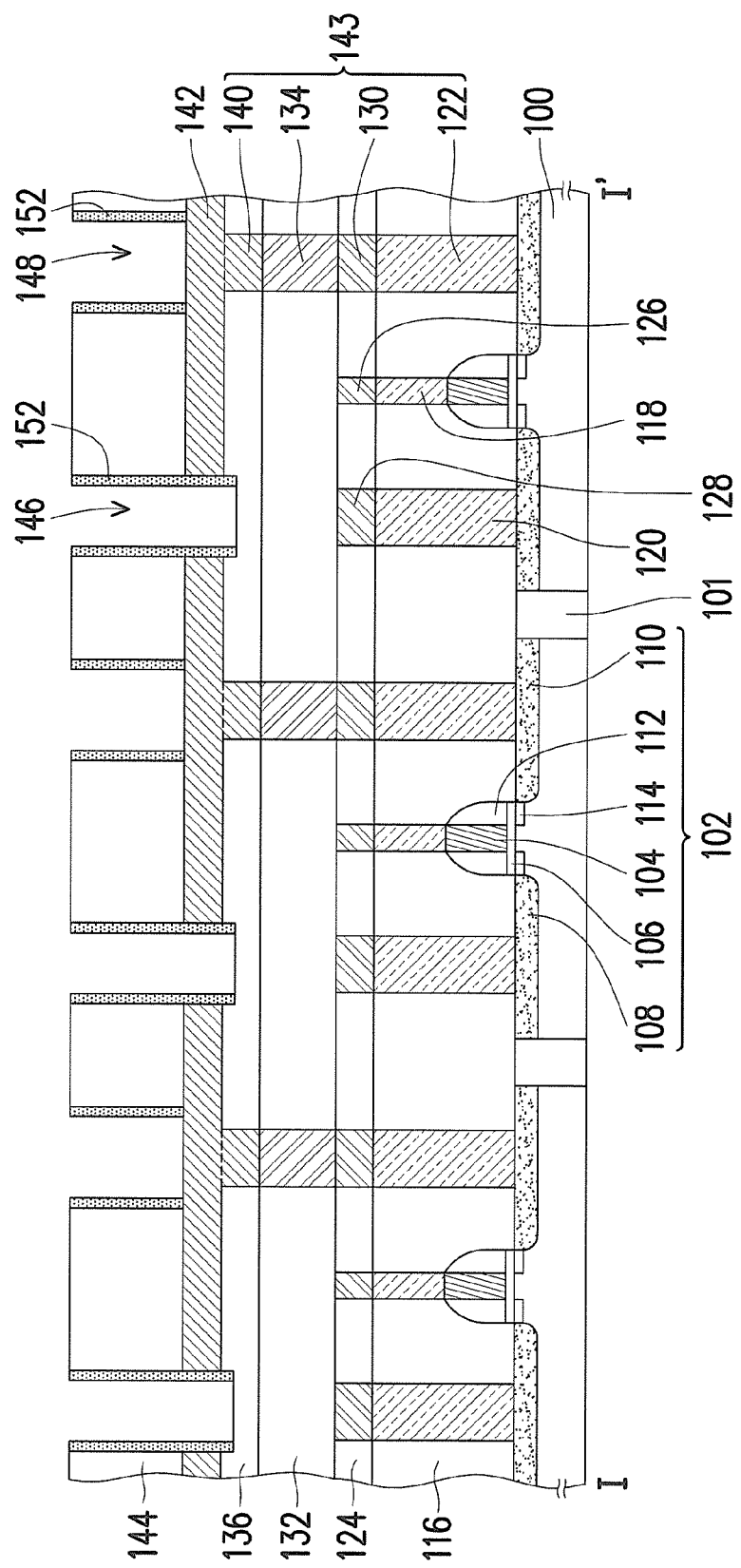

Moreover, referring to FIG. 1, FIG. 2C, and FIG. 3C at the same time, an etch-back process is performed on the variable resistance material layer 150 to form a variable resistance structure 152 on the sidewall of the opening 146. In the present embodiment, the variable resistance structure 152 is, for instance, a variable resistance layer. In the present step, the variable resistance structure 152 is also formed on the sidewall of the opening 148. Moreover, the variable resistance structure 152 can further optionally include an insulating layer (not shown), such that the variable resistance structure 152 has an effect like a diode. As a result, sneak current can be effectively blocked, and therefore the occurrence of disturb is prevented. The insulating layer in the variable resistance structure 152 can be formed by forming an insulating material layer before or after the variable resistance material layer 150 is formed, and then performing an etch-back process on the insulating material layer.

Figure 2D:
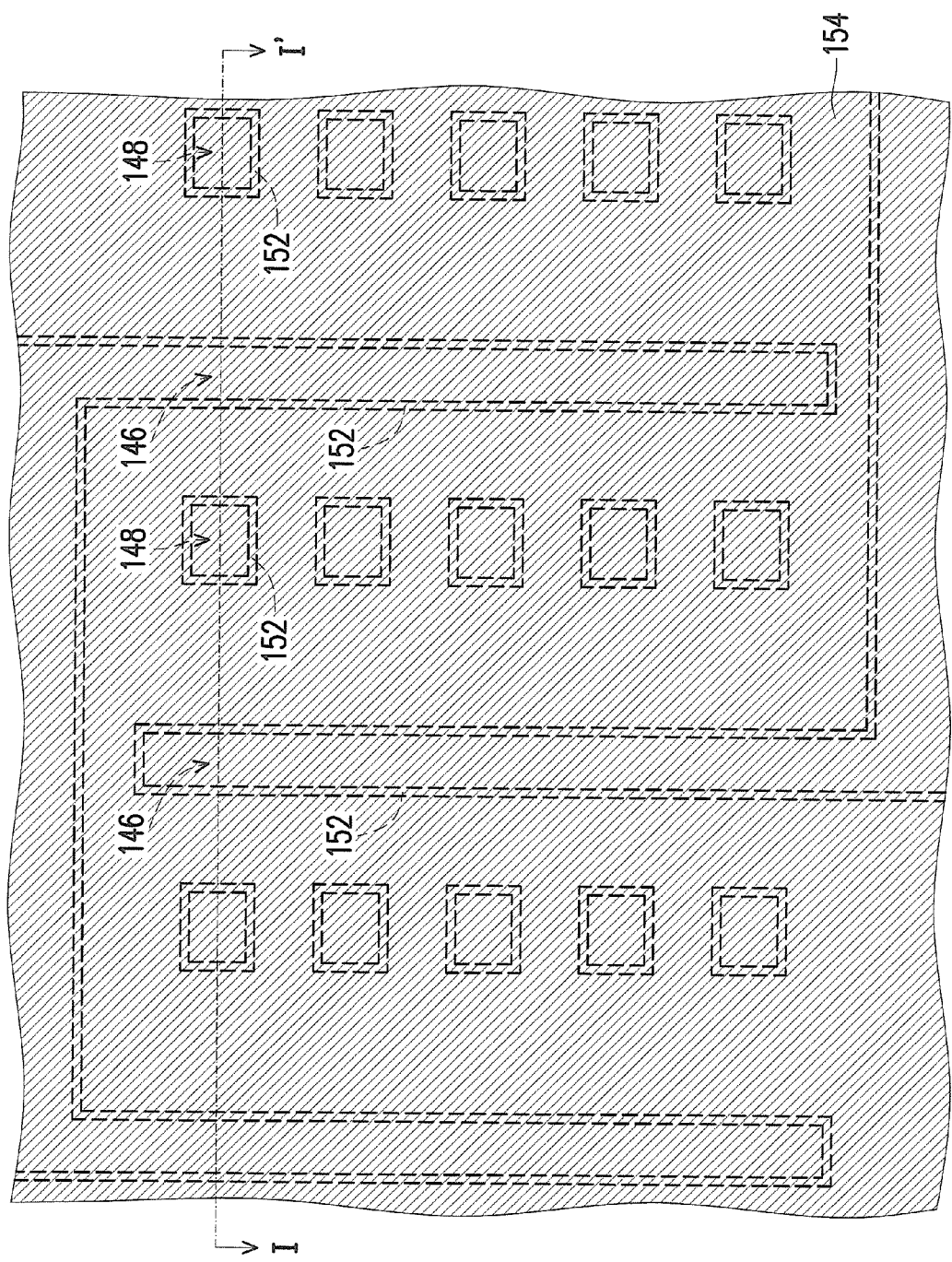
Figure 3D:
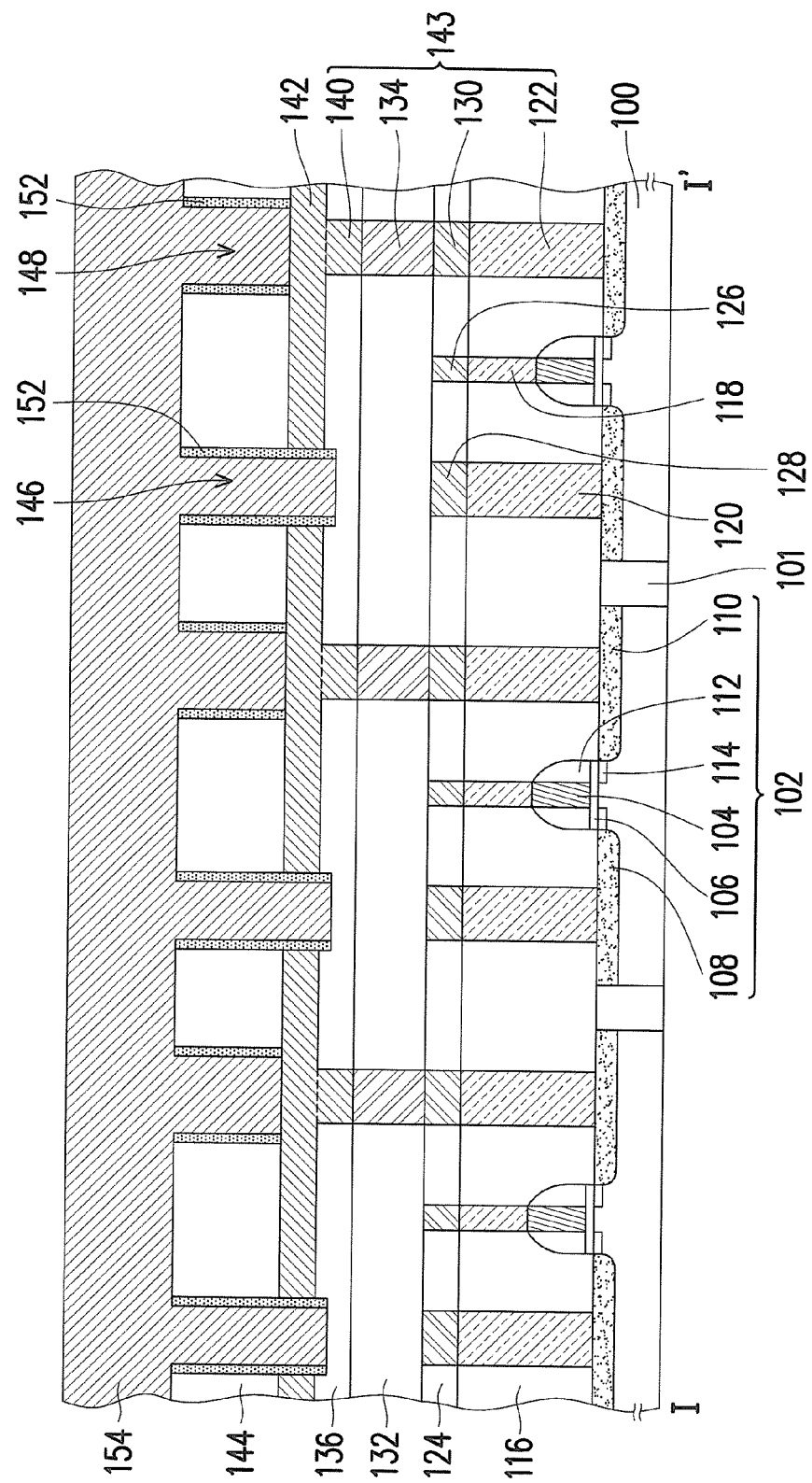

Then, referring to FIG. 1, FIG. 2D, and FIG. 3D at the same time, a conductive line material layer 154 completely filling the opening 146 and the opening 148 is formed. The material of the conductive line material layer 154 is, for instance, copper, tungsten, or aluminum. The forming method of the conductive line material layer 154 is, for instance, an electroplating method or a physical vapor deposition method.

Figure 2E:
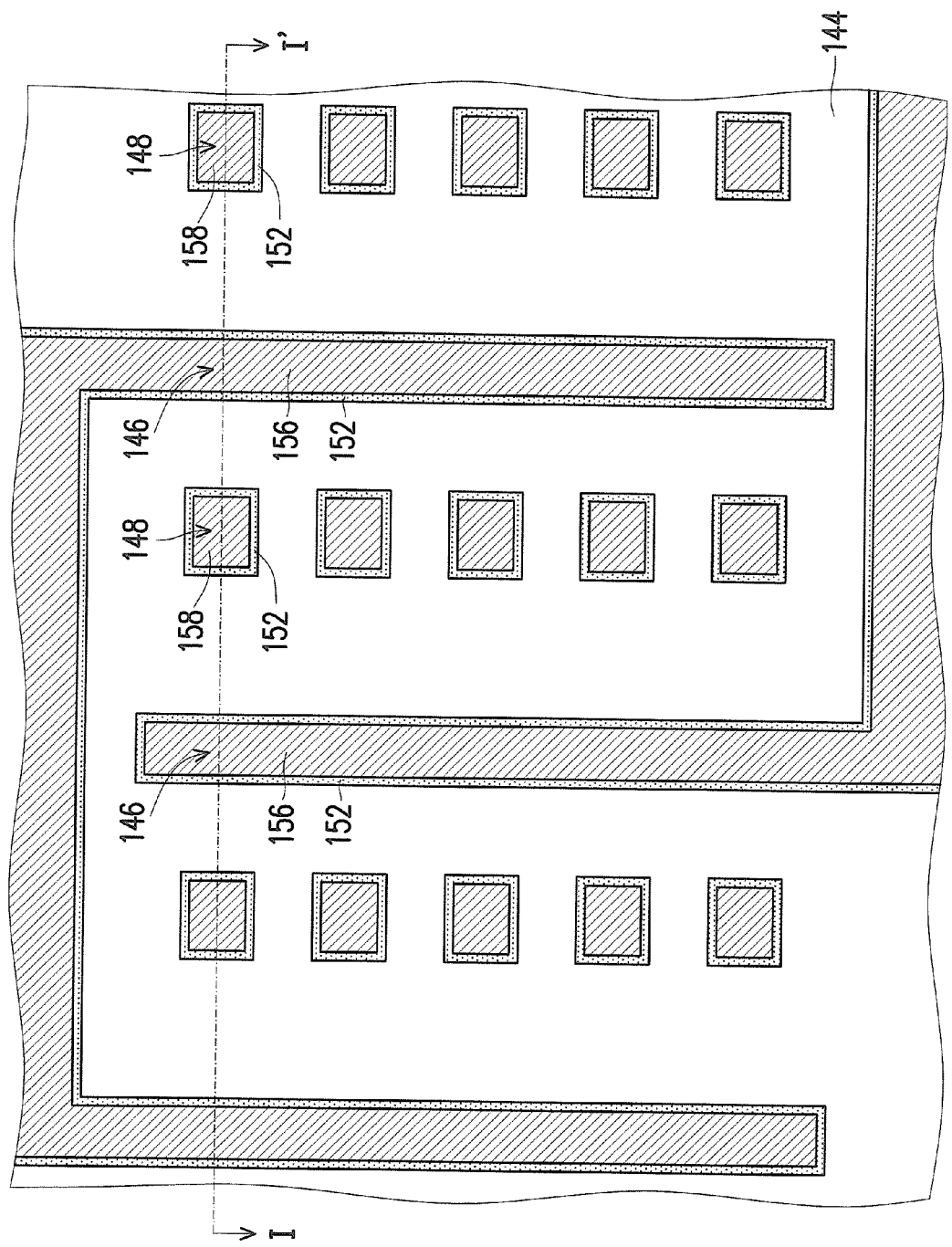
Figure 3E:
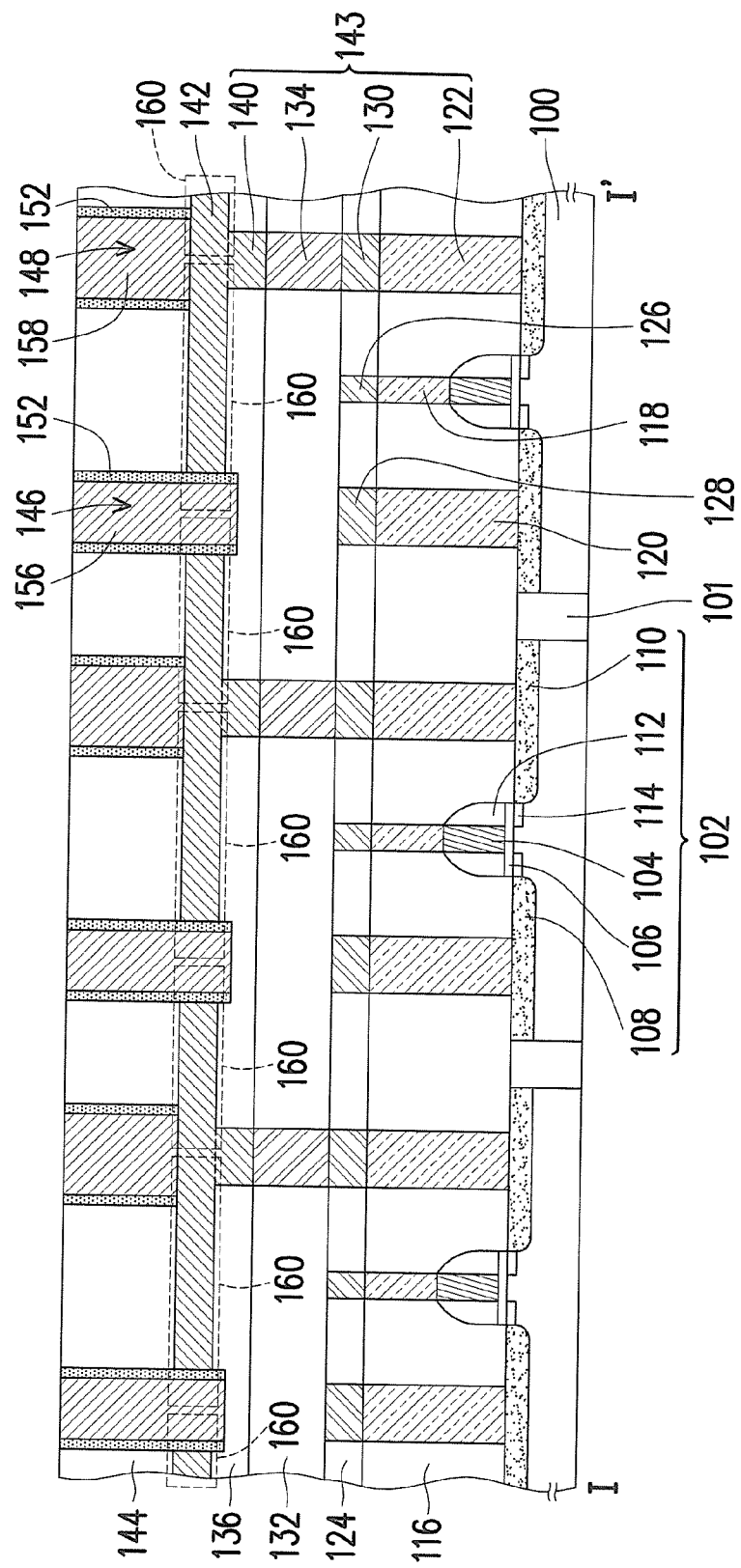
Figure 4:
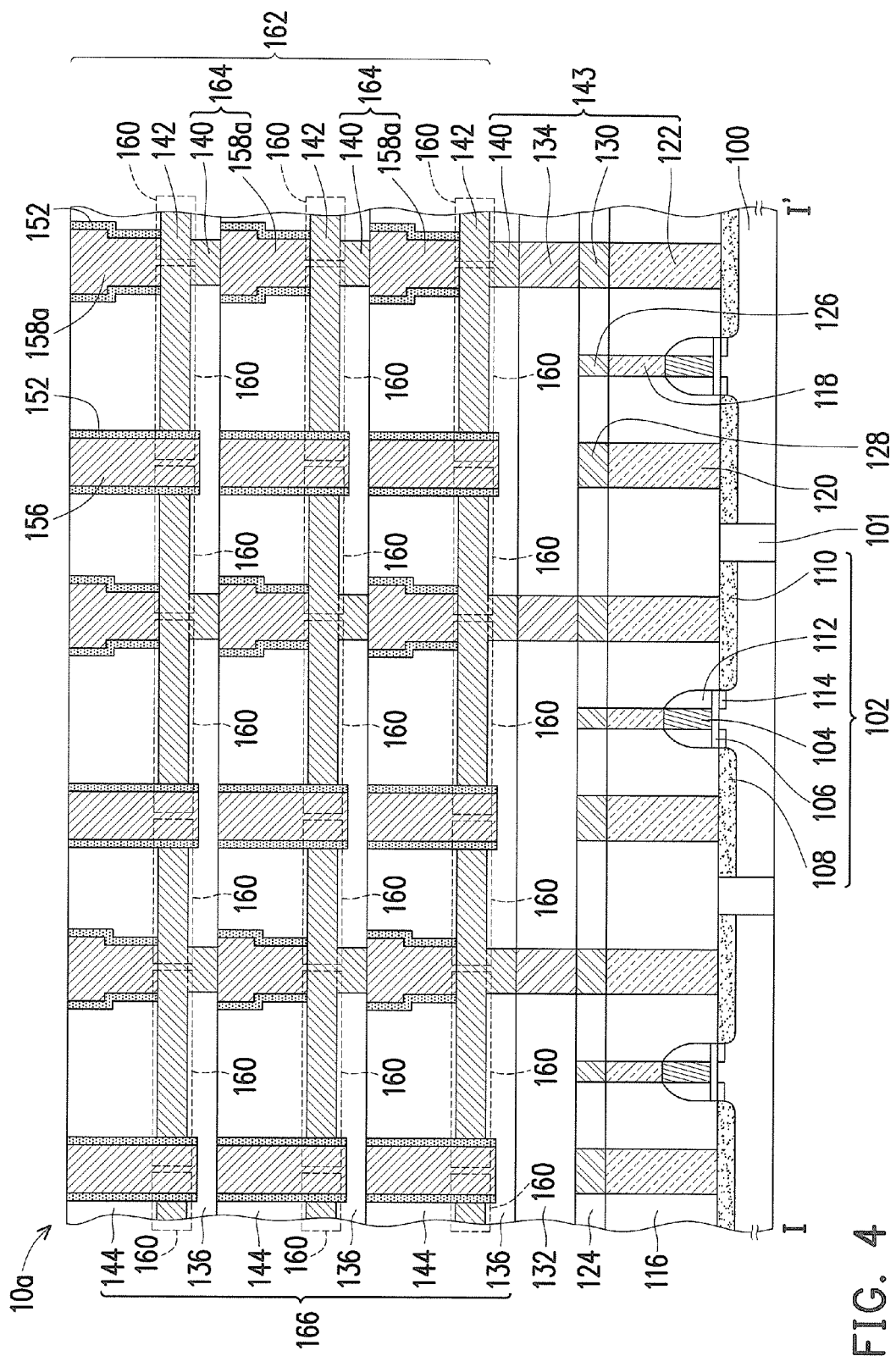
FIG. 4 is a cross-sectional view of an RRAM of another embodiment of the invention.

Then, referring to FIG. 1, FIG. 2E, and FIG. 3E at the same time, the conductive line material layer 154 outside the opening 146 and the opening 148 is removed, so that a conductive line 156 is formed in the opening 146, and a connecting portion 158 is formed in the opening 148. The removal method of the conductive line material layer 154 outside the opening 146 and the opening 148 is, for instance, a chemical mechanical polishing method. The conductive line 156 and the connecting portion 158 are, for instance, formed by the above single damascene method, but the invention is not limited thereto. Moreover, as shown in FIG. 2E, the shape of the conductive line 156 is, for instance, a finger shape, but the invention is not limited thereto. In another embodiment, the shape of the conductive line 156 can also be a strip shape. As shown in FIG. 3E, the shape of the connecting portion 158 is, for instance, a rectangle shape, but the invention is not limited thereto. In another embodiment, the shape of the connecting portion 158 can also be a T shape (as shown in FIG. 4).

Moreover, a memory cell 160 can be formed by the conductive line 142, the conductive line 156, and the variable resistance structure 152. The conductive line 156 is disposed at one side of the conductive line 142, and the top surface of the conductive line 156 is higher than the top surface of the conductive line 142. The variable resistance structure 152 is disposed between the conductive line 142 and the conductive line 156. The variable resistance structure 152 can be further extended to between the conductive line 156 and the dielectric layer 144.

Figure 2F:
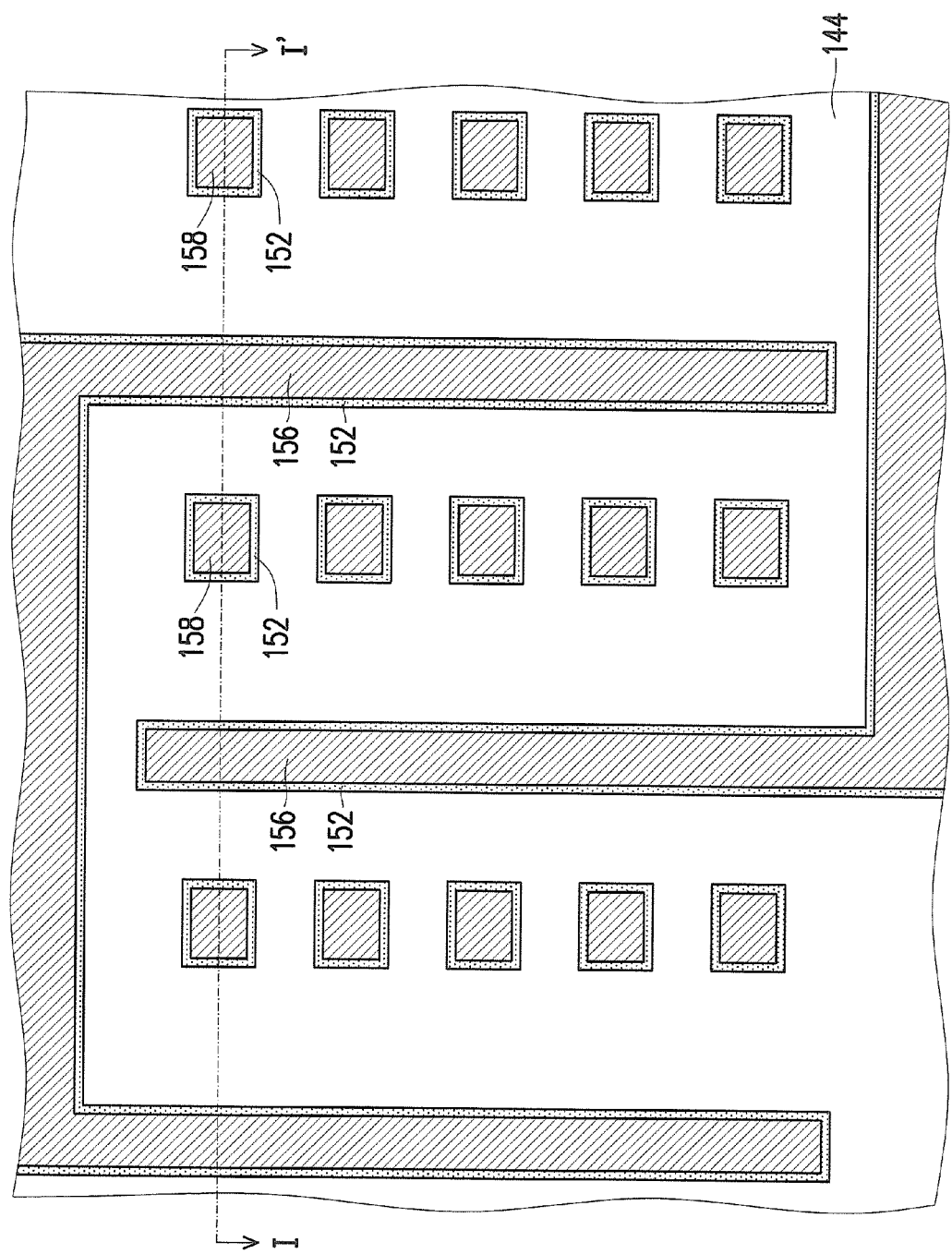
Figure 3F:
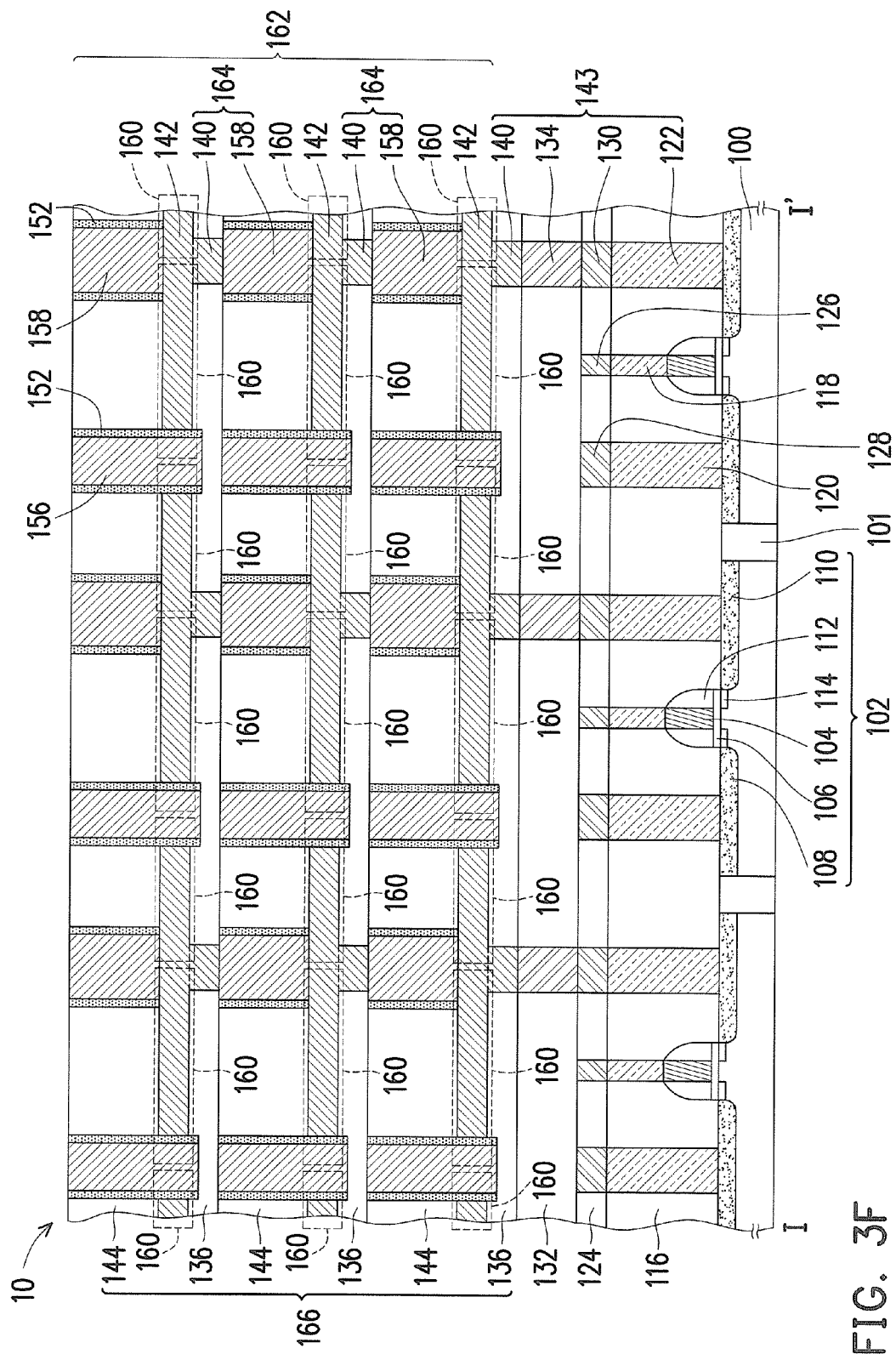

Then, referring to FIG. 1, FIG. 2F, and FIG. 3F at the same time, the steps of forming the memory cell 160 and the connecting portion 158 can be performed repeatedly to form a memory cell string 162. The memory cell string 162 includes a plurality of memory cells 160 and at least one interconnect structure 164. The interconnect structure 164 includes a connecting portion 158 and the connecting portion 140. The connecting portion 158 is electrically connected to the bottom one of two vertically adjacent conductive lines 142. The connecting portion 140 is electrically connected to the connecting portion 158 and the top one of two vertically adjacent conductive lines 142. The variable resistance structures 152 in the vertically adjacent memory cells 160 are isolated from each other, and adjacent variable resistance structures 152 are, for instance, isolated via the dielectric layer 136. The interconnect structure 164 is connected to the vertically adjacent conductive lines 142. When there is a plurality of the memory cell strings 162, two memory cells 160 located between two horizontally adjacent conductive lines 156 can share the conductive line 142 located therebetween. Two memory cells 160 located between two horizontally adjacent conductive lines 142 can share the conductive line 156 located therebetween. Moreover, the repeatedly formed dielectric layers 136 and 144 are stacked to form a dielectric layer 166. Those having ordinary skill in the art can adjust the number of times that the forming steps of the memory cell 160 and the connecting portion 158 are repeated according to product design requirements. In the present embodiment, a plurality of memory cell strings 162 are shown for explanation, but the invention is not limited thereto, and the scope of the invention includes the forming of at least one memory cell string 162.

Via the above manufacturing method, a 1 transistor driving n resistive memory cells (1T-NR) RRAM 10 is complete. The RRAM 10 of the above embodiments is a 3D RRAM having high-density arrangement. Moreover, since the above manufacturing method does not need to include a deep etching process and a deep hole-filling process, the manufacturing method can be directly integrated with an advanced logic process (such as a complementary metal-oxide-semiconductor (CMOS) logic process). Moreover, in the above manufacturing method, routing distance can be reduced by minimizing the distance between the memory cell strings 162 so as to minimize parasitic capacitance value. Moreover, the manufacturing method of each layer of the memory cell 160 is simple, and therefore the manufacture of the RRAM 10 can be complete via a manufacturing process repeated in a simple manner.

In the following, the structure of the RRAM 10 of the present embodiment is described with reference to FIG. 1, FIG. 2F, and FIG. 3F.

Referring to FIG. 1, FIG. 2F, and FIG. 3F at the same time, the RRAM 10 includes a substrate 100, a dielectric layer 166, and at least one memory cell string 162. The dielectric layer 166 is disposed on the substrate 100. The dielectric layer 166 includes dielectric layers 136 and 144 and the dielectric layer 144 is disposed on the dielectric layer 136. The memory cell string 162 includes a plurality of memory cells 160 and at least one interconnect structure 164. The memory cells 160 are vertically and adjacently disposed in the dielectric layer 166, and each of the memory cells 160 includes a conductive line 142, a conductive line 156, and a variable resistance structure 152. The conductive line 156 is disposed at one side of the conductive line 142, and the top surface of the conductive line 156 is higher than the top surface of the conductive line 142. The variable resistance structure 152 is disposed between the conductive line 142 and the conductive line 156. The variable resistance structures 152 in the vertically adjacent memory cells 160 are isolated from each other. Moreover, the variable resistance structure 152 can also be vertically extended to between the conductive line 156 and the dielectric layer 144 and between the conductive line 156 and the dielectric layer 136. The interconnect structure 164 is connected to the vertically adjacent conductive lines 142. The interconnect structure 164 includes a connecting portion 158 and a connecting portion 140. The connecting portion 158 is electrically connected to the bottom one of two vertically adjacent conductive lines 142. The connecting portion 140 is electrically connected to the connecting portion 158 and the top one of two vertically adjacent conductive lines 142. When there is a plurality of the memory cell strings 162, two memory cells 160 located between two horizontally adjacent conductive lines 156 can share the conductive line 142 located therebetween. Two memory cells 160 located between two horizontally adjacent conductive lines 142 can share the conductive line 156 located therebetween.

The RRAM 10 can further include at least one transistor 102. The transistor 102 is disposed on the substrate 100. The doped region 110 (i.e., terminal) of the transistor 102 can be electrically connected to the conductive line 142 via at least one interconnect structure 143, but the method of electrical connection of the transistor 102 and the conductive line 142 is not limited thereto. In the present embodiment, although the transistor 102 is exemplified as a planar transistor, the invention is not limited thereto. In other embodiments, the transistor 102 can also adopt a vertical transistor to further reduce the wafer area occupied by the transistor 102, and thereby increase space utilization. Moreover, when there is a plurality of the transistors 102, the RRAM 10 can further include at least one isolation structure 101. The isolation structures 101 are disposed in the substrate 100, and the transistors 102 are isolated from one another via the isolation structures 101.

Moreover, the RRAM 10 can further optionally include a source line 138 (as shown in FIG. 1). The material of the source line 138 is, for instance, copper, tungsten, or aluminum. The forming method of the source line 138 can include a combination of a lithography process, an etching process, and a deposition process, or a damascene method. The source line 138 can be electrically connected to the doped region 108 via the conductive layer 128 and the conductive layer 120.

Moreover, the material, the disposition method, the forming method, and the efficacy of each of the components in the RRAM 10 are as described for the manufacturing method of FIG. 3A to FIG. 3F and are therefore not repeated herein.

FIG. 4 is a cross-sectional view of an RRAM of another embodiment of the invention.

Referring to both FIG. 3F and FIG. 4, the difference between the embodiment of FIG. 4 and the embodiment of FIG. 3F is as follows. The shape of a connecting portion 158a in an RRAM 10a of FIG. 4 is a T shape, and the shape of the connecting portion 158 in the RRAM 10 of FIG. 3 is a rectangular shape. Since the shape of the connecting portion 158a is a T shape having a wide top and a narrow bottom, the subsequent connecting portion 140 can be more readily aligned with the connecting portion 158a. The forming method of the connecting portion 158a is, for instance, a dual damascene method such as a via-first dual damascene method, a trench first dual damascene method, or a self-aligned dual damascene method. Moreover, the same reference numerals as FIG. 3 are used for the other components in the RRAM 10a of FIG. 4 and descriptions thereof are omitted.

Based on the above, the RRAMs 10 and 10a of the above embodiments at least have the following characteristics. The variable resistance structures 152 in the vertically adjacent memory cells 160 are isolated from one another, the vertically adjacent conductive lines 142 are connected via the interconnect structure 164, and the top surface of the conductive line 156 is higher than the top surface of the conductive line 142. As a result, in the manufacturing process of the RRAMs 10 and 10a, a deep etching process and a deep hole-filling process do not need to be performed, and therefore the manufacturing process can be directly integrated with an advanced logic process (such as a complementary metal-oxide-semiconductor (CMOS) logic process).

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A resistive random access memory, comprising:
    a substrate;
    a dielectric layer disposed on the substrate; and
    at least one memory cell string, comprising:
        a plurality of memory cells, wherein the memory cells are vertically and adjacently disposed in the dielectric layer, and each of the memory cells comprises:
            a first conductive line;
            a second conductive line disposed at one side of the first conductive line, and a top surface of the second conductive line is higher than a top surface of the first conductive line; and
            a variable resistance structure disposed between the first conductive line and the second conductive line, wherein
            the variable resistance structures in the vertically adjacent memory cells are isolated from each other; and
        at least one first interconnect structure connected to the vertically adjacent first conductive lines.

2. The resistive random access memory of claim 1, wherein the at least one first interconnect structure comprises:
    a first connecting portion electrically connected to the bottom one of two vertically adjacent first conductive lines; and
    a second connecting portion electrically connected to the first connecting portion and the top one of two vertically adjacent first conductive lines.

3. The resistive random access memory of claim 2, wherein a shape of the first connecting portion comprises a rectangle shape or a T shape.

4. The resistive random access memory of claim 2, wherein each of the first conductive lines and the second connecting portion therebelow are an integrally formed component or independent components.

5. The resistive random access memory of claim 1, wherein each of the variable resistance structures is extended to between each of the second conductive lines and the dielectric layer.

6. The resistive random access memory of claim 1, wherein when the at least one memory cell string is a plurality of memory cells, two memory cells located between two horizontally adjacent second conductive lines share the first conductive line located therebetween.

7. The resistive random access memory of claim 1, wherein when the at least one memory cell string is a plurality of memory cells, two memory cells located between two horizontally adjacent first conductive lines share the second conductive line located therebetween.

8. The resistive random access memory of claim 1, further comprising at least one transistor disposed on the substrate, and a terminal of the at least one transistor is electrically connected to the first conductive lines via at least one second interconnect structure.

9. The resistive random access memory of claim 8, further comprising, when the at least one transistor is a plurality of transistors, at least one isolation structure disposed in the substrate, and the transistors are isolated from one another via the at least one isolation structure.

10. A manufacturing method of a resistive random access memory, comprising:
    forming a dielectric layer on a substrate; and
    forming at least one memory cell string in the dielectric layer, the at least one memory cell string comprising:
        a plurality of memory cells, wherein the memory cells are vertically and adjacently disposed in the dielectric layer, and each of the memory cells comprises:
            a first conductive line;
            a second conductive line disposed at one side of the first conductive line, and a top surface of the second conductive line is higher than a top surface of the first conductive line; and
            a variable resistance structure disposed between the first conductive line and the second conductive line, wherein
            the variable resistance structures in the vertically adjacent memory cells are isolated from each other; and
        at least one interconnect structure connected to the vertically adjacent first conductive lines.

11. The method of claim 10, wherein a forming method of the dielectric layer comprises a chemical vapor deposition method.

12. The method of claim 10, wherein a forming method of the first conductive lines comprises a damascene method or a combination of a lithography process, an etching process, and a deposition process.

13. The method of claim 10, wherein the at least one interconnect structure comprises:
    a first connecting portion electrically connected to the bottom one of two vertically adjacent first conductive lines; and
    a second connecting portion electrically connected to the first connecting portion and the top one of two vertically adjacent first conductive lines.

14. The method of claim 13, wherein a forming method of each of the variable resistance structures, each of the second conductive lines, and the first connecting portion comprises:
    forming a first opening and a second opening in the dielectric layer, wherein a portion of the first opening exposes a sidewall of each of the first conductive lines, and the second opening exposes a portion of each of the first conductive lines;
    conformally forming a variable resistance material layer in the first opening;
    performing an etch-back process on the variable resistance material layer;
    forming a conductive line material layer completely filling the first opening and the second opening; and
    removing the conductive line material layer outside the first opening and the second opening.

15. The method of claim 13, wherein a shape of the first connecting portion comprises a rectangle shape or a T shape.

16. The method of claim 15, wherein when the shape of the first connecting portion is the rectangle shape, a forming method of the first connecting portion comprises a single damascene method.

17. The method of claim 15, wherein when the shape of the first connecting portion is the T shape, a forming method of the first connecting portion comprises a dual damascene method.

18. The method of claim 13, wherein each of the first conductive lines and the second connecting portion therebelow are integrally formed or independently formed.

19. The method of claim 10, further comprising, before the dielectric layer is formed, forming at least one transistor on the substrate, and a terminal of the at least one transistor is electrically connected to the first conductive lines via at least one second interconnect structure.

20. The method of claim 19, further comprising, when the at least one transistor is a plurality of transistors, forming at least one isolation structure in the substrate, and the transistors are isolated from one another via the at least one isolation structure.

\* \* \* \* \*